(12) United States Patent
Utsunomiya

(10) Patent No.: US 7,084,501 B2
(45) Date of Patent: Aug. 1, 2006

(54) INTERCONNECTING COMPONENT

(75) Inventor: Hisanobu Utsunomiya, Suwa (JP)

(73) Assignee: Interconnection Technologies Inc., Nagano (JP)

( * ) Notice: Subject to any disclaimer, the term of this patent is extended or adjusted under 35 U.S.C. 154(b) by 106 days.

(21) Appl. No.: 10/828,160

(22) Filed: Apr. 21, 2004

(65) Prior Publication Data
US 2005/0017344 A1 Jan. 27, 2005

(51) Int. Cl.
H01L 23/48 (2006.01)
H01L 23/52 (2006.01)

(52) U.S. Cl. ..................... 257/741; 257/692

(58) Field of Classification Search ............... 257/741
See application file for complete search history.

(56) References Cited

U.S. PATENT DOCUMENTS

| 3,932,226 | A | * | 1/1976 | Klatskin et al. | ............. 438/619 |
| 4,813,129 | A | * | 3/1989 | Karnezos | ................... 29/832 |
| 5,982,635 | A | * | 11/1999 | Menzies et al. | ............ 361/790 |
| 6,098,282 | A | * | 8/2000 | Frankeny et al. | ............ 29/852 |
| 2002/0134685 | A1 | * | 9/2002 | Chakravorty et al. | ....... 205/125 |
| 2003/0013228 | A1 | * | 1/2003 | Hotchkiss et al. | .......... 438/106 |
| 2004/0108587 | A1 | * | 6/2004 | Chudzik et al. | ............ 257/700 |

* cited by examiner

Primary Examiner—Tu-Tu Ho
(74) Attorney, Agent, or Firm—Birch Stewart Kolasch & Birch LLP

(57) ABSTRACT

The wide usable interconnecting component of the present invention is capable of reducing number of components or electric elements and reducing number of interconnecting sections without limiting circuit design. The interconnecting component electrically interconnects electric components, and the interconnecting component acts as an electric element. Namely, the interconnecting component acts as a passive element or an active element.

11 Claims, 3 Drawing Sheets

INTERCONNECTING COMPONENT

BACKGROUND OF THE INVENTION

This invention is related to the interconnection component that is the passive devices and/or the active devices that the interconnection component that composes an electric circuit is connected between the electrode parts electrically.

These days, the motherboard printed circuit board for system LSI application and other applications, are mounted on the LSI bear chips, MCMs (multi-chip module), semiconductor packages, discrete passive components such as the capacitor, the resistor with higher system integration, higher density mounting and interconnecting technologies.

Number of discrete components, especially passive devices, on a motherboard has been increasing by the demand of highly function of the electric products. For example, in a cellular phone, 300–500 passive components are mounted with respect to one IC chip; in a personal computer, about 2,200 passive components are mounted with respect to one microprocessor. A space for the surface of the printed circuit board for components mounting is limited, thus there is limitation for using surface mount technology to mounting a large number of components on the printed circuit board. Moreover, it becomes difficult to secure interconnection reliability that the tendency of mounting components are increasing brings to increasing the number of interconnection sections.

Since the rates of the passive components that occupied the mounting area of the printed circuit board assembly are increasing, the embedded passive and/or active devices technology has been developed. The components embedded printed circuit boards are using inner layer lamination sheet that made by conventional subtractive method and/or buildup method, etc. For example, a capacitor is formed in the printed circuit board by the steps of: forming a dielectric layer between a power layer and a ground layer; and forming electrodes by etching. Further, a resistor is formed in the printed circuit board by the steps of: forming a high resistivity metal layer between the power layer and the ground layer; and forming electrodes by etching. By adopting the embedded components printed circuit board can reduce the number of passive components from the surface of printed circuit board without sacrifice the components mounting density. Furthermore, the thin film capacitor can be located nearest section of semiconductor devices for reducing signal wiring length. As the results, the electrical characteristic of the embedded components printed circuit board can be improved.

However, there is the circuit design limitation for the typical embedded components printed circuit board by subtractive method and/or buildup method, due to the inner layer material or passive element forming material. Because embedded capacitors and resistors are formed with particular inner layers, such as between power layer and ground layer, then materials are laminated for complete printed circuit board. In addition, there is the fabrication limitation that capacitors and resistors cannot be provided in the same layer of the printed circuit board due to the same kind of elements can be provided in one layer. Therefore, new means for flexibility designing circuits and reducing number of interconnecting sections without expanding an occupying space of electric components is required now.

A conventional means for electrically interconnecting a semiconductor chip to a printed circuit board is shown in FIG. 4. Interconnecting sections or terminals 53 of the semiconductor chip (or a semiconductor package) 51 and the printed circuit board 52 are solder balls or metal bumps. The semiconductor chip 51 is electrically interconnected to land sections 54 of the printed circuit board 52, and further electrically interconnected to power line (layer) 56 and ground line (layer) 57 by plated through-hole sections 55. The terminals 53 are made of a good conductive material with low resistance so as to secure interconnection reliability and electrical performance.

SUMMARY OF THE INVENTION

The inventor of the present invention studied and found that number of components mounted in a limited space and number of interconnecting sections between the components can be reduced, without limiting circuit design of a printed circuit board, by replacing the terminals 53 with interconnecting components acting as passive elements and/or active elements.

An object of the present invention is to provide a wide usable interconnecting components, which is capable of reducing number of components (or electric elements) and number of interconnecting sections without limiting circuit design.

To achieve the object, the interconnecting component of the present invention has following structures.

Namely, the interconnecting component electrically interconnects electric components, and the interconnecting component acts as an electric element.

The interconnecting component may comprise:
a substrate;
electrodes being formed on the substrate; and
an electric element being provided in the substrate and interconnected to the electrodes.

The interconnecting component may comprise:
a substrate;
a film layer being formed on the substrate, the film layer being made of at least one material, which is selected from a group of dielectric materials, insulators, magnetic substance, resistances, semiconductors and good conductors; and
electrodes being formed on the film layer,
wherein the film layer acts as the electric element.

The interconnecting component may comprise:
a metal cylinder section;
electrodes being provided to the metal cylinder section;
an electric element being provided in the metal cylinder section, the electric element being interconnected to the electrodes; and
an insulating member being provided between the electric element and an inner face of the metal cylinder section.

In the interconnecting component, the electric element may be a passive element or an active element.

The interconnecting component may act as a resistance, a capacitor, an inductor, a semiconductor, etc..

Further, the interconnecting component may electrically interconnect semiconductors, printed circuit boards, a semiconductor chip and a printed circuit board, a semiconductor package and a printed circuit board, a connector and a plug socket, etc..

By employing the interconnecting component of the present invention, number of components (or electric elements), e.g., capacitors, resistors, can be reduced, so that a large number of components can be mounted in a limited space. Since the interconnecting component acts as a passive or an active element, number of bypass interconnections, which are wiring pattern formed on a printed circuit board, can be reduced, so that wiring length of the passive element can be shortened. Further, the interconnecting component acting as a capacitor or a resistor can be provided close to a semiconductor chip (or a semiconductor package), so that electric characteristics of the semiconductor chip and a circuit including the semiconductor chip can be improved.

Inductance of the interconnecting component is lower than that of discrete passive components, so that resistance and capacitance of the interconnecting component can be greater than those of passive components embedded in a printed circuit board, and their allowances can be severer. Further, by employing the interconnecting component instead of discrete passive components, number of solder interconnections can be reduced, so that reliability of interconnection can be higher.

Unlike the conventional embedded printed circuit board, various electric elements can be provided in the interconnecting component of the present invention, so electric circuits can be flexible designed, and they can be easily tested.

Since the interconnecting component can be applied to not only terminals but also other interconnecting sections of electric circuits, wide usable electric devices can be realized.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

In the following embodiments, interconnecting component for interconnecting a semiconductor chip (or a semiconductor package) to a printed circuit board will be explained as examples.

Figure 1:
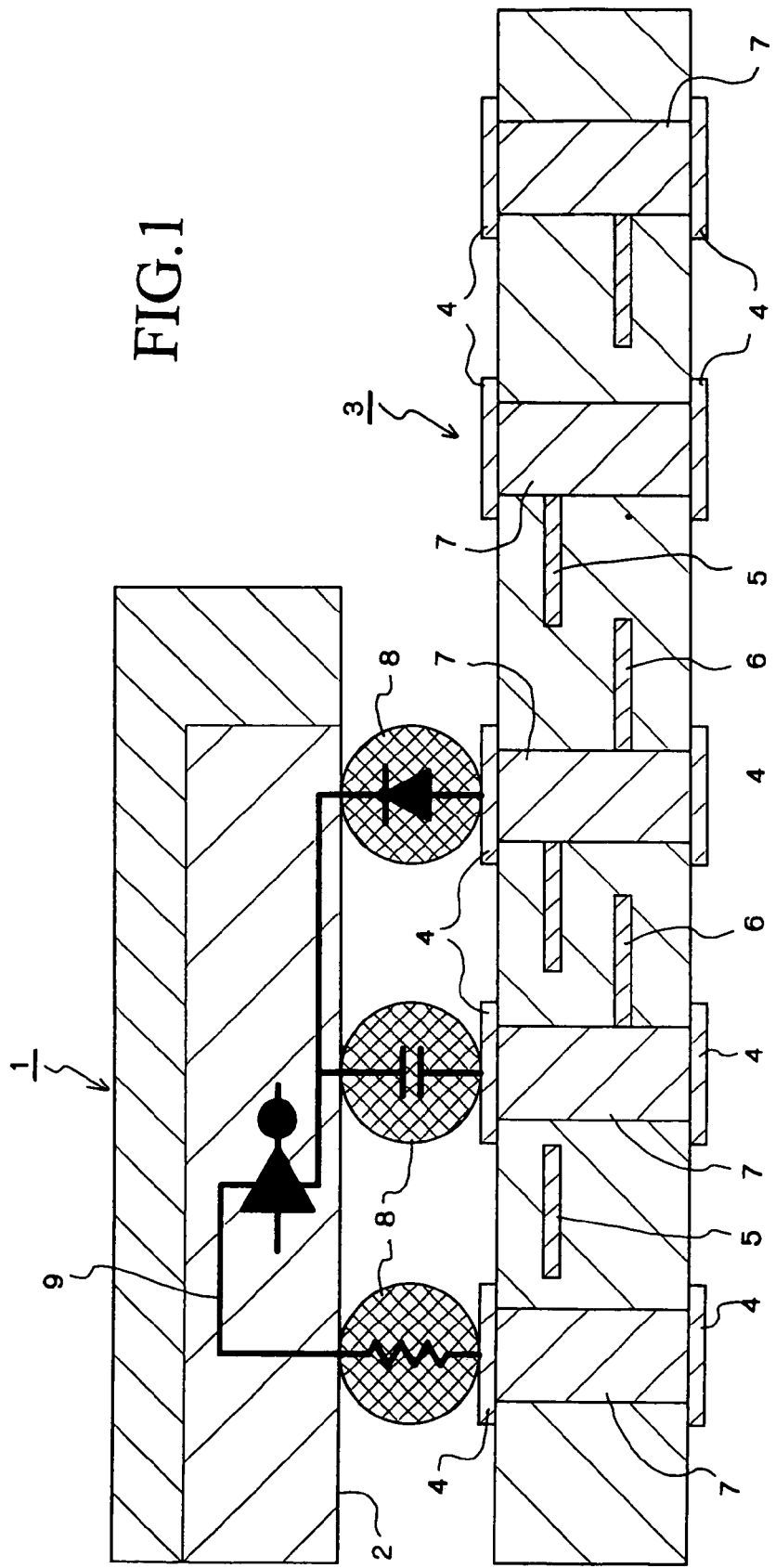
FIG. 1 is a sectional view of a semiconductor chip or package interconnected to a printed circuit board by interconnecting components of an embodiment of the present invention.

FIG. 1 is a sectional view of the semiconductor chip (or package) interconnected to the printed circuit board by interconnecting components of the present invention; FIGS. 2A–2D are explanation views showing the steps of manufacturing a spherical interconnecting component; FIG. 3A is a transverse sectional view of a columnar interconnecting component; and FIG. 3B is a longitudinal sectional view of the columnar interconnecting component.

Firstly, the interconnecting components interconnecting the semiconductor chip (or package) to the printed circuit board will be explained with reference to FIG. 1.

The semiconductor chip (or package) 1 is encapsulated with resin other than a terminal face 2. Signal layers 4 are formed on both faces of the printed circuit board 3; a power layer 5 and a ground layer 6 are formed in the printed circuit board 3. The signal layers 4 are electrically interconnected to the power layer 5 and the ground layer 6 by plated through-holes 7. Note that, an interposer (a circuit substrate) may be provided between the semiconductor chip 1 and the interconnecting components 8 for interconnection.

The interconnecting components 8 include electric elements: passive elements, e.g., resistor, capacitor; active elements, e.g., diode, light emitting diode. Preferably, the interconnecting components 8 are formed into spherical shape, e.g., solder ball, and/or columnar shape, e.g., bump. The interconnecting components 8 are provided between the semiconductor chip 1 and the printed circuit board 3 so as to form components of an electric circuit 9.

As described above, the interconnecting components 8 are formed into the spherical shape or the columnar shape, but the shape is not limited to them. For example, sheet-shaped interconnecting components may be employed as parts of the circuit 9. To securely interconnect the interconnecting components 8 to the printed circuit board 3, anisotropic conductive resin or solder paste may be applied to land sections of the printed circuit board 3.

The interconnecting components 8 include the passive elements and the active element, and their upper ends and lower ends are electrodes. And, the electrodes are respectively electrically interconnected to terminals of the semiconductor chip 1 and the printed circuit board 3.

Next, the interconnecting components 8 will be explained. The spherical interconnecting components 8 is shown in FIG. 2D. In the case of the interconnecting components 8 acting as capacitor, an insulating film 11, which is made of a dielectric materials or an insulator, is formed on an outer face of a spherical ceramic substrate 10. Electrodes 12 are formed on an outer face of the insulating film 11 and respectively provided to at upper portion and a lower portion of the interconnecting components 8.

In another case, the electrodes 12 are formed on an outer face of a spherical insulating substrate, and a passive element, e.g., resistor, or an active element, e.g., diode, is provided in the substrate and interconnected to the electrodes 12 (see FIG. 1). Namely, the electric element is an embedded element.

Next, a method of manufacturing the interconnecting components 8 acting as capacitors will be explained with reference to FIGS. 2A–2D.

Figure 2A:
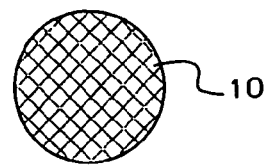
FIGS. 2A–2D are explanation views showing the steps of manufacturing a spherical interconnecting component.
Figure 3A:
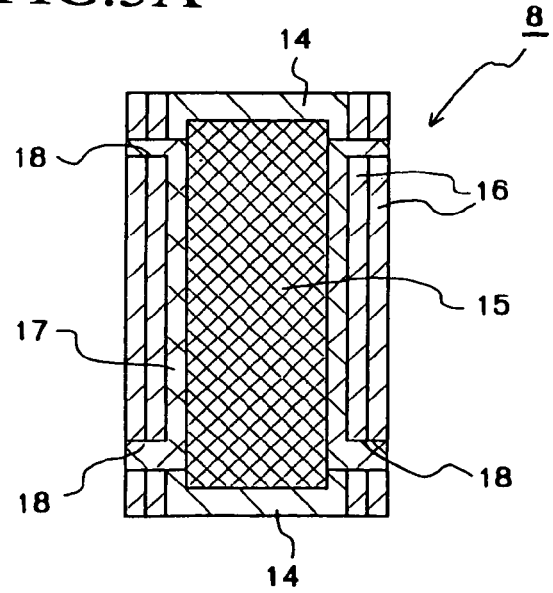
FIG. 3A is a transverse sectional view of a columnar interconnecting component.
Figure 3B:
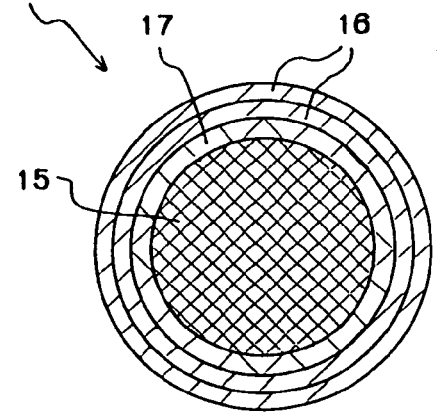
FIG. 3B is a longitudinal sectional view of the columnar interconnecting component.
Figure 4:
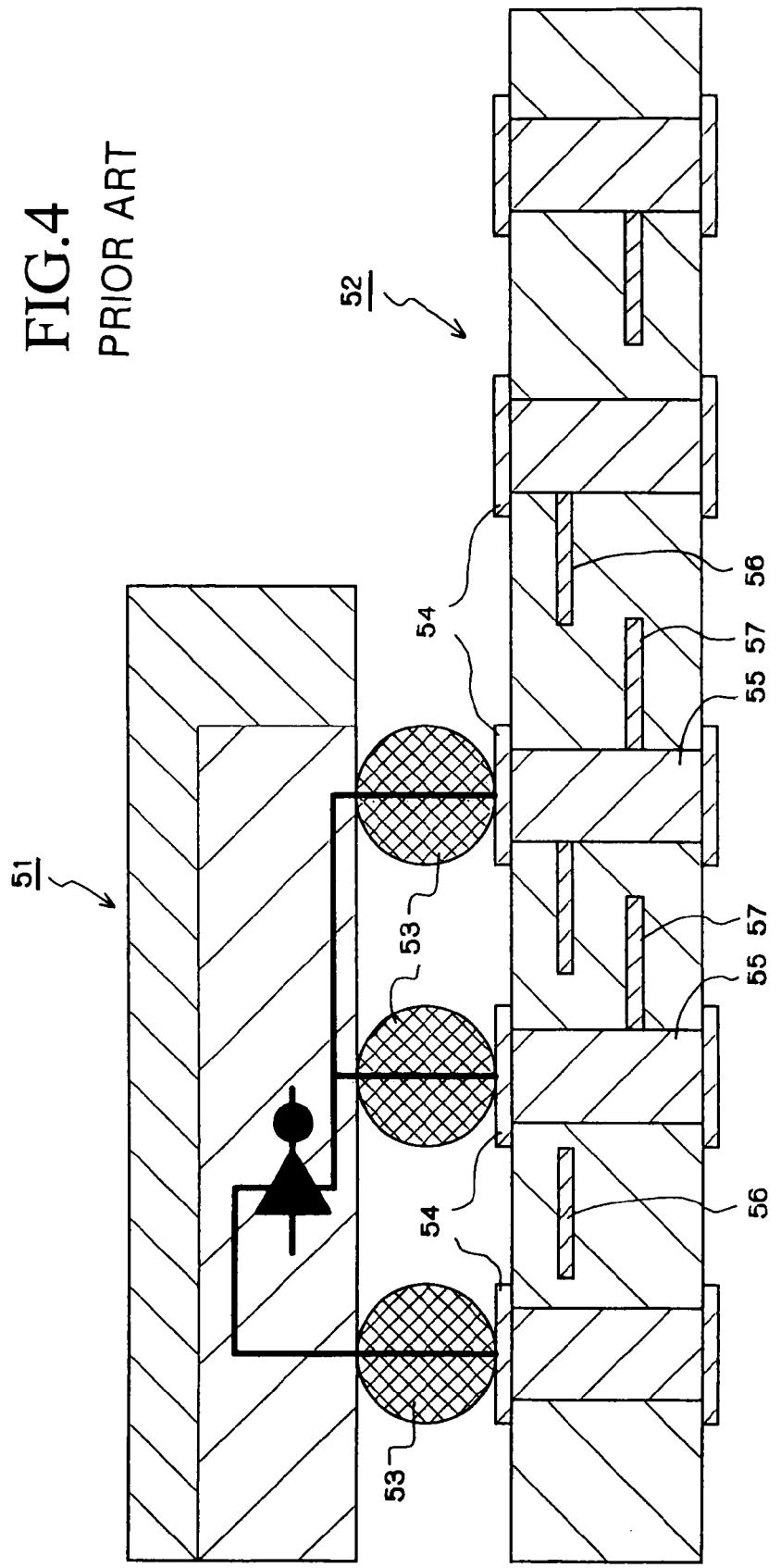
FIG. 4 is a sectional view showing the conventional interconnection means between the semiconductor chip and the printed circuit board.

In FIG. 2A, the ceramic substrate 10 is formed into the spherical shape. The spherical substrate 10 is made of a dielectric material, e.g., barium titanate ($BaTiO_3$), silicon dioxide ($SiO_2$).

Figure 2B:
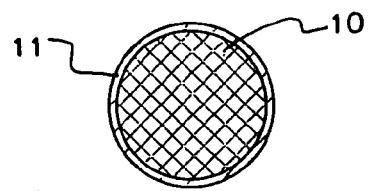

In FIG. 2B, the insulating film 11, which is made of, for example, a dielectric material, e.g., polyimide, is formed on an outer face of the spherical ceramic substrate 10. Note that, the steps shown in FIGS. 2A and 2B may be repeated several times.

Figure 2C:
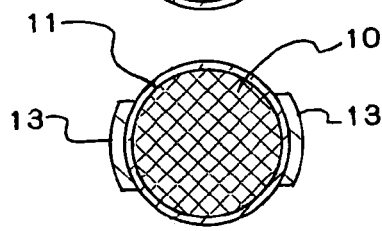
Figure 2D:
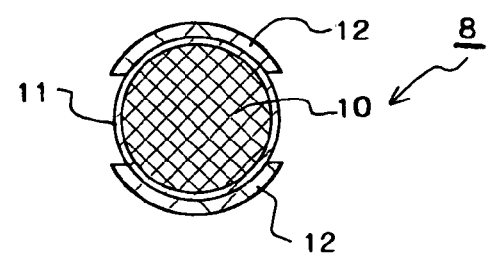

In FIG. 2C, an outer face of the insulating film 11 other than electrode patterns is covered with photo-resist 13.

In FIG. 2D, metal layers are formed onto the electrode patterns of the insulating film 11, which are not covered with photo-resist 13, by proper manner, e.g., spattering, solder plating, solder dipping. Finally, the photo-resist 13 is removed by, for example, etching, so that the electrodes 12 are formed, and the interconnecting component 8, which acts as capacitor, is completed.

In another case, the substrate 10 (see FIG. 2A) is made of a nickel alloy instead of a ceramic so as to form the interconnecting component acting as a resistor.

Further, in other cases, a film layer made of at least one material, which is selected from a group of dielectric material, insulators, magnetic substances, resistors, semiconductors and good conductors, is formed on an outer face of a substrate, and electrodes are formed on an outer face of the film layer. With this structure, the interconnecting component acting as a resistor, a capacitor, an inductor, a semiconductor, etc. can be produced.

FIGS. 3A and 3B show the interconnecting component having a columnar shape. An electric element 15, e.g., a resistor, is provided in a metal cylindrical section 16, and its both ends are respectively connected to electrodes 14, which are fixed to both ends of the cylindrical section 16. An insulating material 17 is provided between an inner face of the cylindrical section 16 and the resistance 15.

A method of manufacturing the columnar interconnecting component 8 will be explained. Cap members 14, which act as the electrodes, are respectively interconnected to both ends of the metallic member 15, which acts as a resistor, by caulking or welding. The resistor 15 including the electrodes 14 is enclosed by a thin metal plate 16, e.g., an aluminum plate, which are formed into a cylindrical shape. Through-holes 18 are bored in an upper portion and a lower portion of the cylindrical section 16. Finally, the insulating material 17, e.g., a dielectric material, is introduced into the cylindrical section 16 via the through-holes 18 so as to fill a space between the inner face of the cylindrical section 16 and the resistance 15 with the insulating material 17.

With these steps, the interconnecting component 8 including the resistor 15 is completed. Note that, a dielectric material may be provided in the cylindrical section 16 instead of the resistor 15 so as to produce the interconnecting component including a capacitor. Further, a coil may be provided in the cylindrical section 16 instead of the resistor 15 so as to produce the interconnecting component including an inductor.

By employing the interconnecting component 8 which acts as a passive element or an active element, number of components (or electric elements), e.g., capacitors, resistor, can be reduced, so that a large number of components can be mounted in a limited space. Since the interconnecting component acts as a passive or an active element, number of bypass interconnections, which are cable pattern formed on the printed circuit board 3, can be reduced, so that wiring length of the passive element can be shortened. Further, the interconnecting component acting as a capacitor or a resistor can be provided close to the semiconductor chip (or a semiconductor package) 1, so that electric characteristics of the semiconductor chip 1 can be improved.

Inductance of the interconnecting component is lower than that of discrete passive parts, so that resistance and capacitance of the interconnecting component can be greater than those of passive components embedded into a printed circuit board, and their allowances can be severer. Further, by employing the interconnecting component instead of discrete passive components, number of solder interconnections can be reduced, so that reliability of interconnection can be higher.

Unlike the conventional embedded printed circuit board, various electric elements can be provided in the interconnecting component 8, so the electric circuit 19 on the printed circuit board 3 can be flexible designed, and they can be easily tested.

Further, active elements, e.g., a laser diode, may be included in the interconnecting component 8. In this case, for example, an optical semiconductor circuit of a signal circuit has a first interconnecting component, which includes a light emitting element, and a second interconnecting component, which includes a light detect element.

In the above described embodiments, the interconnecting components are used to interconnect the semiconductor chip (or package) to the printed circuit board, but the present invention is not limited to the embodiments. The interconnecting component of the present invention may electrically interconnect semiconductors each other, circuit boards each other, a semiconductor chip and a printed circuit board, a semiconductor package and a printed circuit board, a connector and a plug socket, etc..

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. A structure comprising:
   electrical parts; and
   an interconnecting component electrically connecting said electrical parts, said interconnecting component acting as an electric element;
   wherein one of said electrical parts is a circuit board having a terminal, and the other electrical parts is a semiconductor chip having a terminal;
   said interconnecting component is a resistance, in which electrodes are respectively formed at both ends of a resistive element; and
   the resistance is disposed between the circuit board and the semiconductor chip, and the electrodes of the resistance are respectively connected the terminals of the circuit board and the semiconductor chip.

2. The structure according to claim 1, wherein the resistive element is formed into a spherical shape.

3. The structure according to claim 1, wherein the resistive element is formed into a columnar shape.

4. A structure comprising:
   electrical parts; and
   an interconnecting component electrically connecting said electrical parts, said interconnecting component acting as an electric element;
   wherein one of said electrical parts is a circuit board having a terminal, and the other electrical parts is a semiconductor chip having a terminal;
   said interconnecting component is a capacitor, in which electrodes are respectively formed at both ends of a dielectric element; and
   the capacitor is disposed between the circuit board and the semiconductor chip, and the electrodes of the capacitor are respectively connected the terminals of the circuit board and the semiconductor chip.

5. The structure according to claim 4, wherein the dielectric element is formed into a spherical shape.

6. The structure according to claim 4, wherein the dielectric element is formed into a columnar shape.

7. A structure comprising:
   electrical parts; and
   an interconnecting component electrically connecting said electrical parts, said interconnecting component acting as an electric element;
   wherein one of said electrical parts is a circuit board having a terminal, and the other electrical parts is a semiconductor chip having a terminal;

said interconnecting component is an active element, in which electrodes are respectively formed at both ends of the active element; and the active element is disposed between the circuit board and the semiconductor chip, and the electrodes of the active element are respectively connected the terminals of the circuit board and the semiconductor chip.

8. The structure according to claim 7, wherein the active element is formed into a spherical shape.

9. The structure according to claim 7, wherein the active element is formed into a columnar shape.

10. The structure according to claim 7, wherein the active element is a diode.

11. The structure according to claim 7, wherein the active element is a light emitting diode.

* * * * *